US012400839B2

(12) United States Patent
Ko (10) Patent No.: US 12,400,839 B2
(45) Date of Patent: Aug. 26, 2025

(54) FOCUS RING AND APPARATUS FOR PROCESSING A SUBSTRATE INCLUDING THE SAME

(71) Applicant: SAMSUNG ELECTRONICS CO., LTD., Suwon-si (KR)

(72) Inventor: Hyungsik Ko, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 141 days.

(21) Appl. No.: 18/517,271

(22) Filed: Nov. 22, 2023

(65) Prior Publication Data

US 2024/0371610 A1 Nov. 7, 2024

(30) Foreign Application Priority Data

May 4, 2023 (KR) .................. 10-2023-0058332

(51) Int. Cl.
*H01J 37/32* (2006.01)
*H01L 21/683* (2006.01)

(52) U.S. Cl.
CPC .. *H01J 37/32642* (2013.01); *H01J 37/32091* (2013.01); *H01J 37/32715* (2013.01); *H01L 21/6833* (2013.01); *H01J 37/3211* (2013.01); *H01J 37/32119* (2013.01); *H01J 37/3244* (2013.01); *H01J 2237/327* (2013.01)

(58) Field of Classification Search
CPC ........... H01J 37/32642; H01J 37/32091; H01J 37/32715; H01J 37/3211; H01J 37/32119; H01J 37/3244; H01J 2237/327; H01L 21/6833
See application file for complete search history.

(56) References Cited

U.S. PATENT DOCUMENTS

| 7,252,738 | B2 | 8/2007 | Tong et al. | |
| 7,758,764 | B2 | 7/2010 | Dhindsa et al. | |
| 7,882,800 | B2 | 2/2011 | Koshiishi et al. | |
| 8,097,105 | B2 | 1/2012 | Shih et al. | |
| 8,449,679 | B2 | 5/2013 | Dhindsa | |
| 8,771,423 | B2 | 7/2014 | Lee et al. | |
| 10,276,354 | B2 * | 4/2019 | Lee | H01J 37/32642 |
| 10,438,833 | B2 * | 10/2019 | Severson | H01L 21/68742 |
| 11,393,663 | B2 * | 7/2022 | Funk | G05B 19/41875 |

(Continued)

FOREIGN PATENT DOCUMENTS

KR 10-1670096 B1 10/2016

*Primary Examiner* — Adam D Houston
(74) *Attorney, Agent, or Firm* — Fish & Richardson P.C.

(57) ABSTRACT

A focus ring includes an inner ring on a periphery of an electrostatic chuck, and an outer ring having an inner circumferential surface surrounding an outer circumferential surface of the inner ring, wherein a lower gap between a lower end of the outer circumferential surface of the inner ring and a lower end of the inner circumferential surface of the outer ring is narrower than an upper gap between an upper end of the outer circumferential surface of the inner ring and an upper end of the inner circumferential surface of the outer ring, and wherein the outer ring includes a thickness-compensating portion on the inner circumferential surface of the outer ring, the thickness-compensating portion being positioned higher than an imaginary straight line between the upper end and the lower end of the inner circumferential surface of the outer ring.

20 Claims, 7 Drawing Sheets

(56) References Cited

U.S. PATENT DOCUMENTS

| | | | |
|---|---|---|---|
| 11,443,923 B2 | 9/2022 | Koai et al. | |
| 11,495,445 B2 | 11/2022 | Uchida et al. | |
| 12,094,752 B2* | 9/2024 | Rice | H01L 21/6831 |
| 12,165,899 B2* | 12/2024 | Oki | H01L 21/67109 |
| 12,176,187 B2* | 12/2024 | Koshimizu | H01J 37/32642 |
| 12,183,554 B2* | 12/2024 | Rathnasinghe | H01L 21/68721 |
| 12,300,465 B2* | 5/2025 | Koshimizu | H01J 37/32715 |
| 2011/0031111 A1* | 2/2011 | Kobayashi | H01J 37/32623 |
| | | | 204/298.36 |
| 2017/0301578 A1* | 10/2017 | Hong | H01J 37/32862 |
| 2019/0013232 A1* | 1/2019 | Yan | H01J 37/20 |
| 2020/0266088 A1* | 8/2020 | Kosakai | H01L 21/76826 |
| 2020/0373193 A1* | 11/2020 | Kamp | H01J 37/32642 |
| 2021/0090935 A1* | 3/2021 | Koai | H01L 21/02019 |
| 2021/0183687 A1 | 6/2021 | Yan et al. | |
| 2022/0223385 A1 | 7/2022 | Oh et al. | |
| 2022/0285136 A1 | 9/2022 | Han et al. | |
| 2022/0359169 A1* | 11/2022 | Koai | H01L 21/68735 |
| 2023/0118651 A1* | 4/2023 | Franklin | H01L 21/6831 |
| | | | 361/234 |
| 2023/0143327 A1* | 5/2023 | Han | H01J 37/32807 |
| | | | 156/345.53 |
| 2024/0347322 A1* | 10/2024 | Sasaki | H01L 21/3065 |
| 2024/0371610 A1* | 11/2024 | Ko | H01J 37/32091 |
| 2024/0395508 A1* | 11/2024 | Chen | H01J 37/32027 |
| 2025/0006516 A1* | 1/2025 | Masuda | H01L 21/6833 |
| 2025/0054735 A1* | 2/2025 | Kwon | H01J 37/32642 |
| 2025/0087464 A1* | 3/2025 | Soh | H01J 37/32642 |
| 2025/0087465 A1* | 3/2025 | Ko | H01L 21/67248 |

* cited by examiner

FOCUS RING AND APPARATUS FOR PROCESSING A SUBSTRATE INCLUDING THE SAME

CROSS-RELATED APPLICATION

This application claims priority under 35 USC § 119 to Korean Patent Application No. 10-2023-0058332, filed on May 4, 2023, in the Korean Intellectual Property Office (KIPO), the contents of which are herein incorporated by reference in their entirety.

BACKGROUND

1. Field

Example embodiments relate to a focus ring and an apparatus for processing a substrate including the same. More particularly, example embodiments relate to a focus ring configured to concentrate plasma on a substrate and an apparatus for processing a substrate including the focus ring.

2. Description of the Related Art

Generally, an apparatus for processing a substrate using plasma may form a layer on the substrate or etch a layer on the substrate. The apparatus may include a focus ring configured to concentrate the plasma on the substrate. The focus ring may include an inner ring and an outer ring.

SUMMARY

According to example embodiments, there may be provided a focus ring. The focus ring may include an inner ring and an outer ring. The inner ring may surround a substrate on an electrostatic chuck (ESC). The outer ring may include an inner circumferential surface configured to surround an outer circumferential surface of the inner ring. A lower gap between a lower end of the outer circumferential surface of the inner ring and a lower end of the inner circumferential surface of the outer ring may be narrower than an upper gap between an upper end of the outer circumferential surface of the inner ring and an upper end of the inner circumferential surface of the outer ring. The outer ring may include a thickness-compensating portion on the inner circumferential surface of the outer ring. The thickness-compensating portion may be positioned higher than a straight line between the upper end and the lower end of the inner circumferential surface of the outer ring.

According to example embodiments, there may be provided a focus ring. The focus ring may include an inner ring and an outer ring. The inner ring may surround a substrate on an electrostatic chuck (ESC). The outer ring may include an inner circumferential surface configured to surround an outer circumferential surface of the inner ring. A lower gap between a lower end of the outer circumferential surface of the inner ring and a lower end of the inner circumferential surface of the outer ring may be narrower than an upper gap between an upper end of the outer circumferential surface of the inner ring and an upper end of the inner circumferential surface of the outer ring. The inner circumferential surface of the outer ring may include a first inclined surface and a second inclined surface. The first inclined surface may be extended from the lower end of the inner circumferential surface of the outer ring at a first inclined angle with respect to a lower surface of the outer ring. The second inclined surface may be extended from an upper end of the first inclined surface to the upper end of the inner circumferential surface of the outer ring at a second inclined angle with respect to the lower surface of the outer ring. The first inclined angle may be greater than the second inclined angle. An upper surface of the outer ring may be positioned lower than an upper surface of the inner ring.

According to example embodiments, there may be provided an apparatus for processing a substrate. The apparatus may include a reaction chamber, an ESC, a plasma generator and a focus ring. The reaction chamber may receive the substrate. The ESC may be arranged in the reaction chamber to support the substrate. The plasma generator may generate plasma in the reaction chamber from a reaction gas. The focus ring may surround the substrate on the ESC. The focus ring may include an inner ring and an outer ring. The inner ring may surround the substrate. The outer ring may include an inner circumferential surface configured to surround an outer circumferential surface of the inner ring. A lower gap between a lower end of the outer circumferential surface of the inner ring and a lower end of the inner circumferential surface of the outer ring may be narrower than an upper gap between an upper end of the outer circumferential surface of the inner ring and an upper end of the inner circumferential surface of the outer ring. The outer ring may include a thickness-compensating portion on the inner circumferential surface of the outer ring. The thickness-compensating portion may be positioned higher than a straight line between the upper end and the lower end of the inner circumferential surface of the outer ring.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, example embodiments will be explained in detail with reference to the accompanying drawings.

Figure 1:
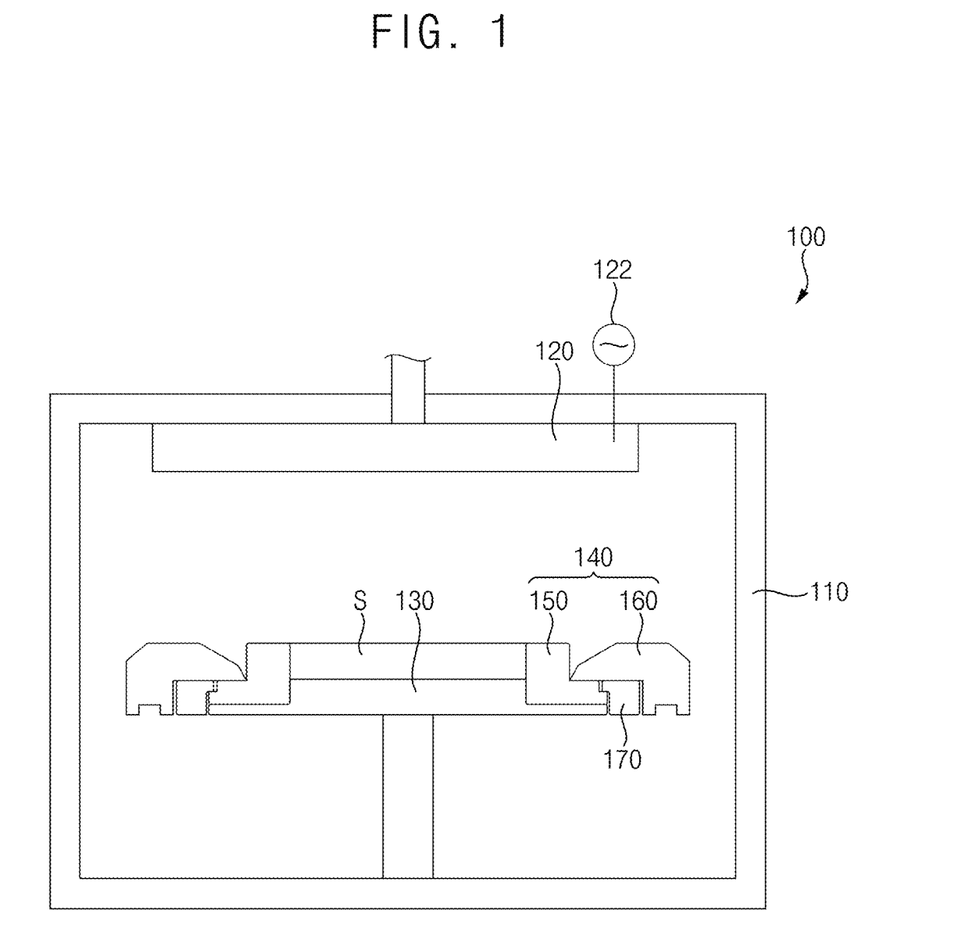
FIG. 1 is a cross-sectional view illustrating a capacitively coupled plasma (CCP) type apparatus for processing a substrate in accordance with example embodiments.
Figure 2:
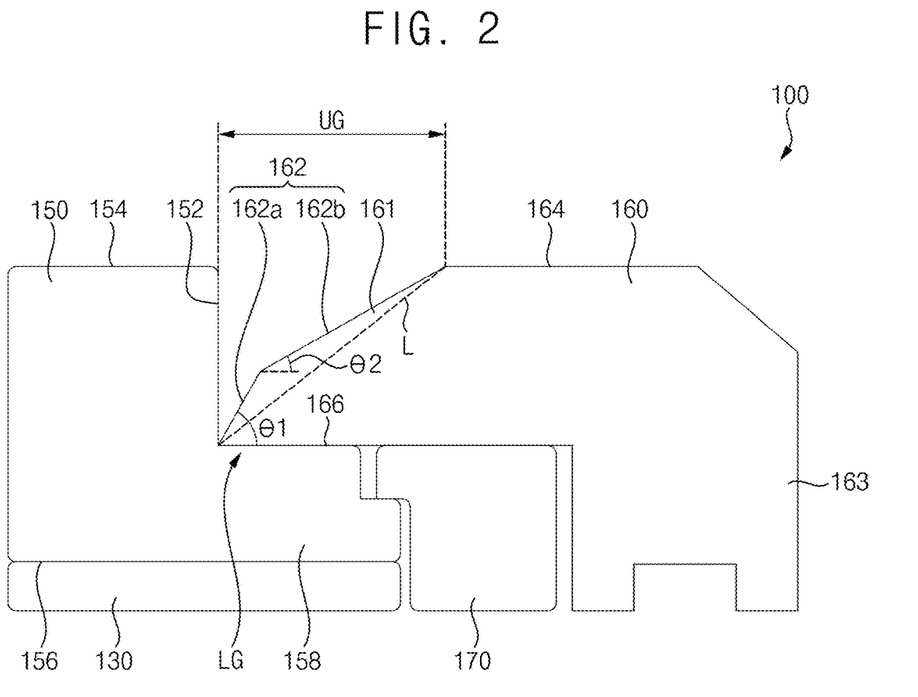
FIG. 2 is an enlarged cross-sectional view illustrating a focus ring of the CCP type apparatus in FIG. 1.

FIG. 1 is a cross-sectional view illustrating capacitively coupled plasma (CCP) type apparatus for processing a substrate in accordance with example embodiments and FIG. 2 is an enlarged cross-sectional view illustrating a focus ring of the CCP type apparatus in FIG. 1.

Referring to FIGS. 1 and 2, a CCP type apparatus 100 for processing a substrate may apply radiofrequency (RF) power to opposite electrodes to generate plasma from a reaction gas using an RF electric field between the electrodes. The CCP type apparatus 100 may include semiconductor fabrication apparatuses configured to process a substrate using the plasma in a reaction chamber, e.g., a deposition apparatus, an etching apparatus, an ashing apparatus, etc.

The CCP type apparatus 100 may include a reaction chamber 110, a showerhead 120, an electrostatic chuck (ESC) 130, a focus ring 140, etc. That is, the CCP type apparatus 100 may include the showerhead 120 as a plasma generator.

The reaction chamber 110 may have an internal space configured to receive a substrate, e.g., a semiconductor substrate S. The reaction chamber 110 may include a vacuum region configured to define a space where the plasma may be formed from a reaction gas.

The showerhead 120 may be arranged at an upper region in the reaction chamber 110. The showerhead 120 may include a plurality of injection holes configured to inject the reaction gas into the reaction chamber 110. An RF power supply 122 may be connected to the showerhead 120. Thus, the showerhead 120 may function as an upper electrode.

The ESC 130 may be arranged at a lower region in the reaction chamber 110, e.g., the ESC 130 and the showerhead 120 may be at opposite sides of the reaction chamber 110. An RF power supply may be connected to the ESC 130. Thus, the ESC 130 may function as a lower electrode. A matcher may be arranged between the RF power supply 122 and the ESC 130. A plurality of lift holes may be vertically formed through the ESC 130.

Additionally, a plurality of lift pins may be movably inserted into the lift holes of the ESC 130. The lift pins may support the semiconductor substrate S. The lift pins may be downwardly moved to place the semiconductor substrate S on an upper surface of the ESC 130. The lift pins may be upwardly moved with the semiconductor substrate S on which a plasma process may be performed.

The focus ring 140 may be arranged at an edge portion of the ESC 130 to surround the semiconductor substrate S. The focus ring 140 may protect an outer circumferential surface of the semiconductor substrate S from the plasma. Further, the focus ring 140 may concentrate the plasma on an upper surface of the semiconductor substrate S. When the CCP type apparatus 100 is an etching apparatus, the focus ring 140 may be partially etched by the plasma. The focus ring 140 may include an inner ring 150 and an outer ring 160.

As illustrated in FIG. 1, the inner ring 150 may be positioned on the ESC 130 and extend along its peripheral edge, e.g., the inner ring 150 may be on a periphery of the ESC 130. The inner ring 150 may surround, e.g., a perimeter of, the semiconductor substrate S. As illustrated in FIG. 2, the inner ring 150 may have an upper surface 154, a lower surface 156, an inner circumferential surface, and an outer circumferential surface 152. The inner circumferential surface of the inner ring 150 may face the semiconductor substrate S. The upper surface 154 and the lower surface 156 of the inner ring 150 may be horizontal planes opposite to each other and substantially parallel to each other, e.g., the upper and lower surfaces 154 and 156 may be parallel to a bottom of the ESC 130. The outer circumferential surface 152 of the inner ring 150 may be a vertical plane, e.g., the outer circumferential surface 152 may be opposite the inner circumferential surface and may face away from the semiconductor substrate S. Further, a protrusion 158 may protrude from the outer circumferential surface 152 of the inner ring 150, e.g., in a direction oriented from the inner ring 150 toward the outer ring 160. The protrusion 158 may protrude in a radial direction of the inner ring 150. For example, the inner ring 150 may include silicon.

As illustrated in FIG. 1, the outer ring 160 may surround, e.g., a perimeter of, the inner ring 150. As illustrated in FIG. 2, the outer ring 160 may have an upper surface 164, a lower surface 166, and an inner circumferential surface 162. The upper surface 164 and the lower surface 166 of the outer ring 160 may be horizontal planes opposite to each other and substantially parallel to each other. In example embodiments, the upper surface 164 of the outer ring 160 may be substantially coplanar with the upper surface 154 of the inner ring 150. The lower surface 166 of the outer ring 160 may be placed on an upper surface of the protrusion 158 of the inner ring 150. For example, the outer ring 160 may include quartz.

The outer ring 160 may include an extension 163 downwardly extended from an outer side portion of the lower surface 166 of the outer ring 160. The extension 163 of the outer ring 160 may be spaced apart from the protrusion 158 (e.g., in a radial direction) to form a space between the extension 163 and the protrusion 158. A fixing ring 170 may be arranged in the space between the extension 163 and the protrusion 158 to fix the inner ring 150.

In example embodiments, a lower gap LG between a lower end of the outer circumferential surface 152 of the inner ring 150 and a lower end of the inner circumferential surface 162 of the outer ring 160 may be narrower than an upper gap UG between an upper end of the outer circumferential surface 152 of the inner ring 150 and an upper end of the inner circumferential surface 162 of the outer ring 160. Thus, a sufficiently large space may be formed between the outer circumferential surface 152 of the inner ring 150 and the inner circumferential surface 162 of the outer ring 160, e.g., the space between the outer circumferential surface 152 of the inner ring 150 and the inner circumferential surface 162 of the outer ring 160 may have an increasing width as a distance from the protrusion 158 of the inner ring 150 increases. An air current including polymers generated in a plasma process may smoothly flow through the space between the inner ring 150 and the outer ring 160. As a result, accumulation of polymers between the inner ring 150 and the outer ring 160 may be suppressed or substantially minimized so that generation of an arc between the inner ring 150 and the outer ring 160 may also be suppressed or substantially minimized.

In detail, as illustrated in FIG. 2, a lowermost end of the inner circumferential surface 162 of the outer ring 160 may contact (e.g., directly contact) a lowermost end of the outer circumferential surface 152 of the inner ring 150. That is, a space may not be formed between the lowermost end of the inner circumferential surface 162 of the outer ring 160 and the lowermost end of the outer circumferential surface 152 of the inner ring 150. Thus, a gap between the lowermost end of the inner circumferential surface 162 of the outer ring 160 and the lowermost end of the outer circumferential surface 152 of the inner ring 150 may be about zero. Because a space may not exist between the lowermost end of the inner circumferential surface 162 of the outer ring 160 and the lowermost end of the outer circumferential surface 152 of the inner ring 150, polymers may not be accumulated between the lowermost end of the inner circumferential surface 162 of the outer ring 160 and the lowermost end of the outer circumferential surface 152 of the inner ring 150.

In order to smooth further the flow of the air current between the inner ring 150 and the outer ring 160, the inner circumferential surface 162 of the outer ring 160 may be placed radially farther from the outer circumferential surface 152 of the inner ring 150 to form a large space between the inner circumferential surface 162 of the outer ring 160 and the outer circumferential surface 152 of the inner ring 150. However, as the outer ring 160 may be, e.g., continuously, worn by plasma so that a thickness of the outer ring 160 may be gradually decreased, it may be required to periodically exchange the outer ring 160 for a new outer ring. That is, as the position of the inner circumferential surface 162 of the outer ring 160 farther from the outer circumferential surface 152 of the inner ring 150 may potentially reduce thickness of the outer ring 160, the thin outer ring 160 may have a short lifespan so that an exchange period of the outer ring 160 may be shortened.

In order to extend the lifespan of the outer ring 160 while also suppressing the arc, the outer ring 160 may include a thickness-compensating portion 161. The thickness-compensating portion 161 may be formed on the inner circumferential surface 162 of the outer ring 160. The thickness-compensating portion 161 may be positioned higher than an imaginary straight line L between the upper end and the lower end of the inner circumferential surface 162 of the outer ring 160 (i.e., the dashed line in FIG. 2). That is, the inner circumferential surface 162 of the outer ring 160 may correspond to an inner circumferential surface of the thickness-compensating portion 161.

In detail, the thickness-compensating portion 161 may include a first inclined surface 162a and a second inclined surface 162b. The first inclined surface 162a may be upwardly extended from the lower end (e.g., lowermost end) of the inner circumferential surface 162 of the outer ring 160. The first inclined surface 162a may have a first inclined angle θ1 with respect to the lower surface 166 of the outer ring 160. The second inclined surface 162b may be upwardly extended from an upper end of the first inclined surface 162a to the upper end of the inner circumferential surface 162 of the outer ring 160. The second inclined surface 162b may have a second inclined angle θ2 with respect to the lower surface 166 of the outer ring 160.

In example embodiments, the first inclined angle θ1 may be greater than the second inclined angle θ2. For example, the first inclined angle θ1 may be about 60°, and the second inclined angle θ2 may be about 30°. Thus, the thickness-compensating portion 161 may have a triangular shape, e.g., so the largest surface of the triangular shape may be the imaginary straight line L. As a result, a slope of the first inclined surface 162a may be greater than a slope of the second inclined surface 162b.

For example, a length of the first inclined surface 162a may be shorter than a length of the second inclined surface 162b. For example, the length of the first inclined surface 162a may be substantially equal to or longer than the length of the second inclined surface 162b. When the length of the first inclined surface 162a is shorter than the length of the second inclined surface 162b, a connection point between the first inclined surface 162a and the second inclined surface 162b, i.e., the upper end of the first inclined surface 162a or the lower end of the second inclined surface 162b, may be positioned closer to the lower surface 166 of the outer ring 160 than to the upper surface 164 of the outer ring 160.

Figure 3:
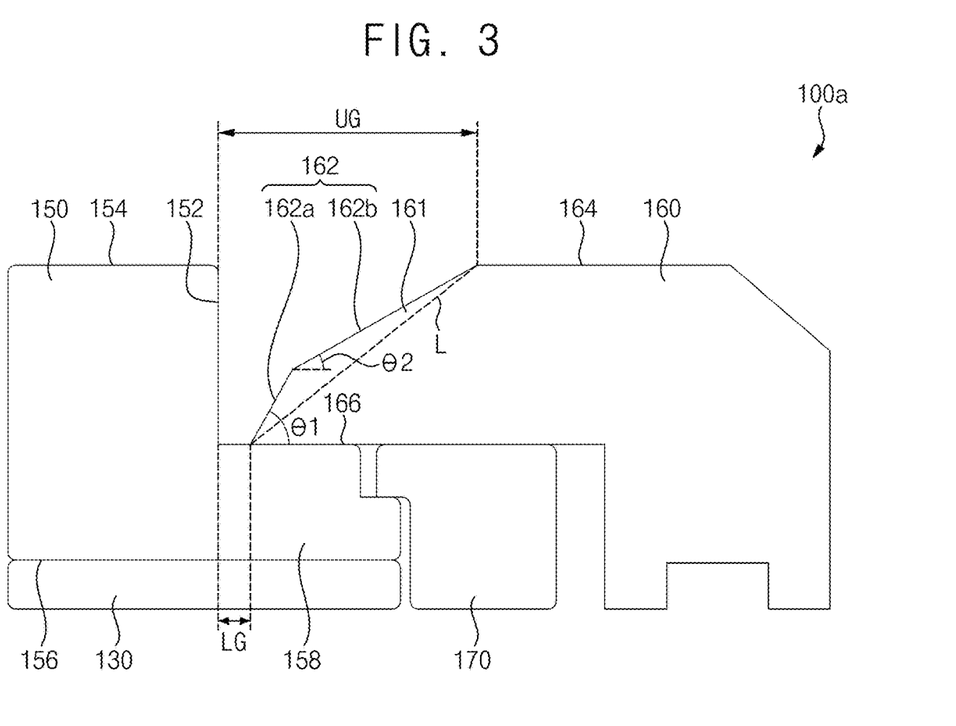
FIG. 3 is an enlarged cross-sectional view illustrating a focus ring of a CCP type apparatus in accordance with example embodiments.

FIG. 3 is an enlarged cross-sectional view illustrating a focus ring of a CCP type apparatus in accordance with example embodiments.

A CCP type apparatus 100a of example embodiments may include elements substantially the same as those of the CCP type apparatus 100 in FIG. 2, except for an outer ring of a focus ring. Thus, same reference numerals refer to the same elements and any further description with respect to the same elements is omitted herein for brevity.

Referring to FIG. 3, a lowermost end of the inner circumferential surface 162 of an outer ring 160a may be spaced apart from the lowermost end of the outer circumferential surface 152 of the inner ring 150 (e.g., in the radial direction to expose a portion of the upper surface of the protrusion 158). Thus, the lower gap LG may be formed between the lowermost end of the inner circumferential surface 162 of the outer ring 160a and the lowermost end of the outer circumferential surface 152 of the inner ring 150. The lower gap LG may be about 0.04 mm to about 2 mm.

Figure 4:
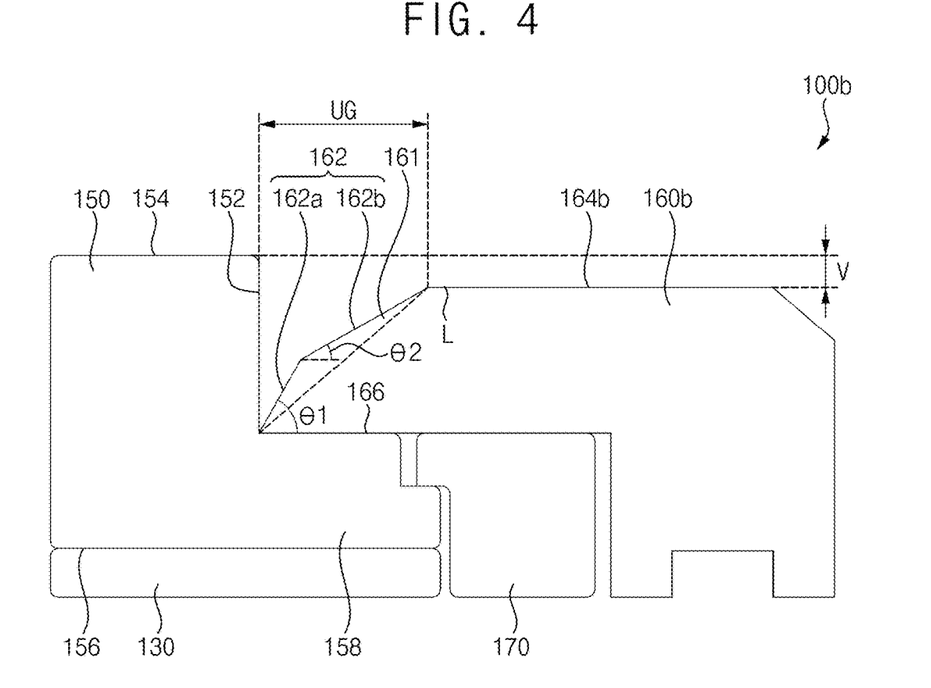
FIG. 4 is an enlarged cross-sectional view illustrating a focus ring of a CCP type apparatus in accordance with example embodiments.

FIG. 4 is an enlarged cross-sectional view illustrating a focus ring of a CCP type apparatus in accordance with example embodiments.

A CCP type apparatus 100b of example embodiments may include elements substantially the same as those of the CCP type apparatus 100 in FIG. 2, except for an outer ring of a focus ring. Thus, same reference numerals refer to the same elements and any further description with respect to the same elements is omitted herein for brevity.

Referring to FIG. 4, an upper surface 164b of an outer ring 160b may be positioned lower than the upper surface 154 of the inner ring 150. That is, a height difference V may be formed between the upper surface 164b of the outer ring 160b and the upper surface 154 of the inner ring 150. For example, the height difference V may be at least about 1 mm.

Because the upper surface 164b of the outer ring 160b may be positioned lower than the upper surface 154 of the inner ring 150, a space through which the air current may smoothly flow may be formed over the outer ring 160b. Thus, the accumulation of the polymers between the inner ring 150 and the outer ring 160b may be suppressed or substantially minimized so that generation of the arc between the inner ring 150 and the outer ring 160b may also be suppressed.

Figure 5:
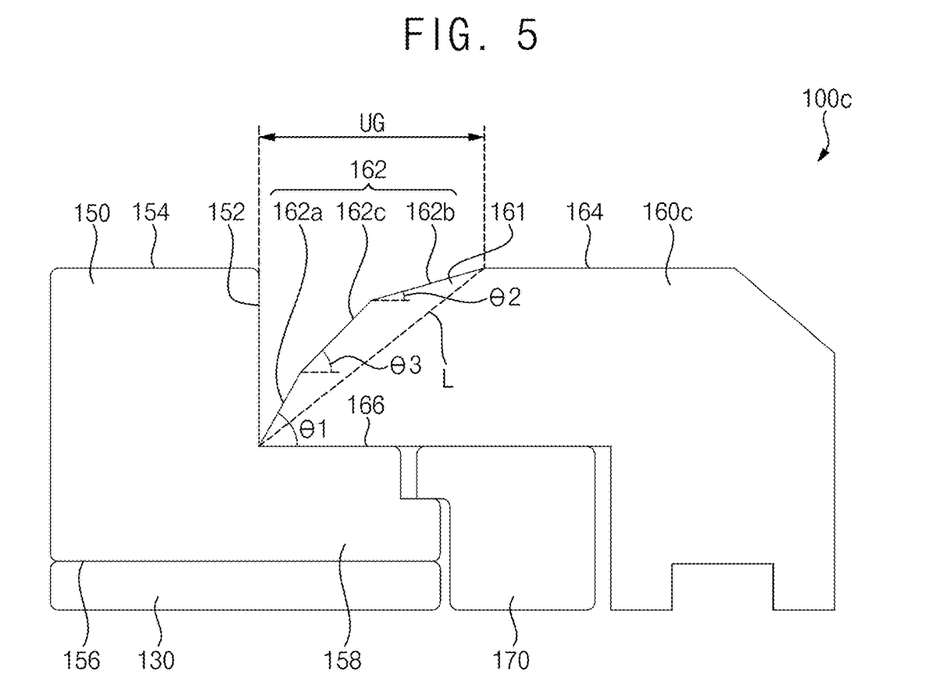
FIG. 5 is an enlarged cross-sectional view illustrating a focus ring of a CCP type apparatus in accordance with example embodiments.

FIG. 5 is an enlarged cross-sectional view illustrating a focus ring of a CCP type apparatus in accordance with example embodiments.

A CCP type apparatus 100c of example embodiments may include elements substantially the same as those of the CCP type apparatus 100 in FIG. 2, except for an outer ring of a focus ring. Thus, same reference numerals refer to the same elements and any further description with respect to the same elements is omitted herein for brevity.

Referring to FIG. 5, the thickness-compensating portion 161 of example embodiments may further include a third inclined surface 162c. The third inclined surface 162c may be extended from the upper end of the first inclined surface 162a to the lower end of the second inclined surface 162b. The third inclined surface 162c may have a third inclined angle θ3 with respect to the lower surface 166 of the outer ring 160. The third inclined angle θ3 may be less than the first inclined angle θ1 and greater than the second inclined angle θ2. Alternatively, the outer ring 160 may include at least four inclined surfaces and/or the structure in FIG. 3 and/or the structure in FIG. 4 with at least three inclined surfaces defining the inclined surface 162.

Figure 6:
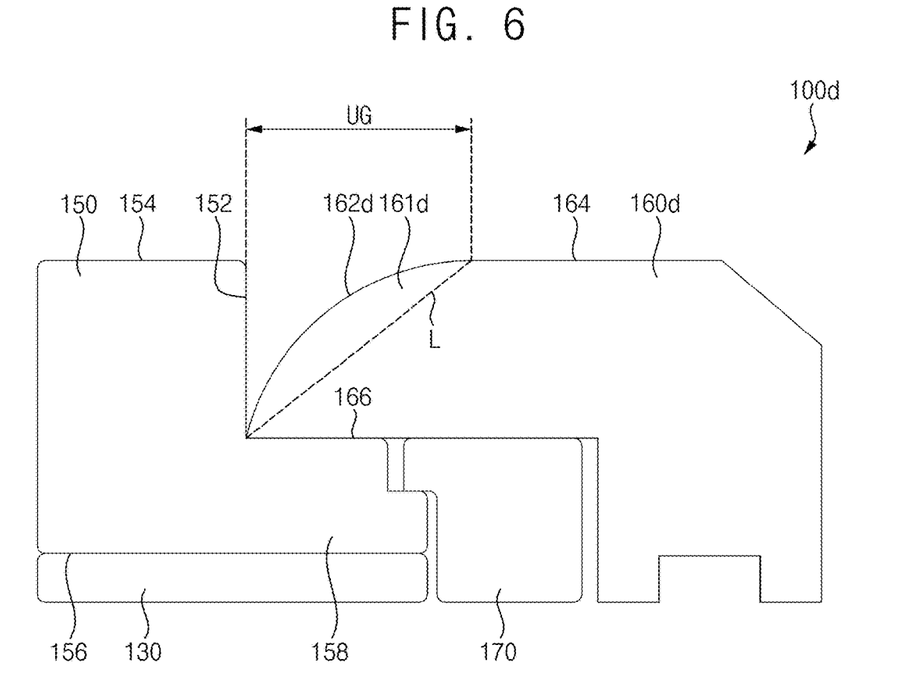
FIG. 6 is an enlarged cross-sectional view illustrating a focus ring of a CCP type apparatus in accordance with example embodiments.

FIG. 6 is an enlarged cross-sectional view illustrating a focus ring of a CCP type apparatus in accordance with example embodiments.

A CCP type apparatus 100d of example embodiments may include elements substantially the same as those of the CCP type apparatus 100 in FIG. 2, except for an outer ring of a focus ring. Thus, same reference numerals refer to the same elements and any further description with respect to the same elements is omitted herein for brevity.

Referring to FIG. 6, a thickness-compensating portion 161d of example embodiments may include a curved inner circumferential surface 162d connected between the upper end and the lower end of the inner circumferential surface 162 of the outer ring 160d. That is, the thickness-compensating portion 161d may have an arc shape. Alternatively, the focus ring of example embodiments may have the structure in FIG. 3 and/or the structure in FIG. 4 with the curved inner circumferential surface 162d.

Figure 7:
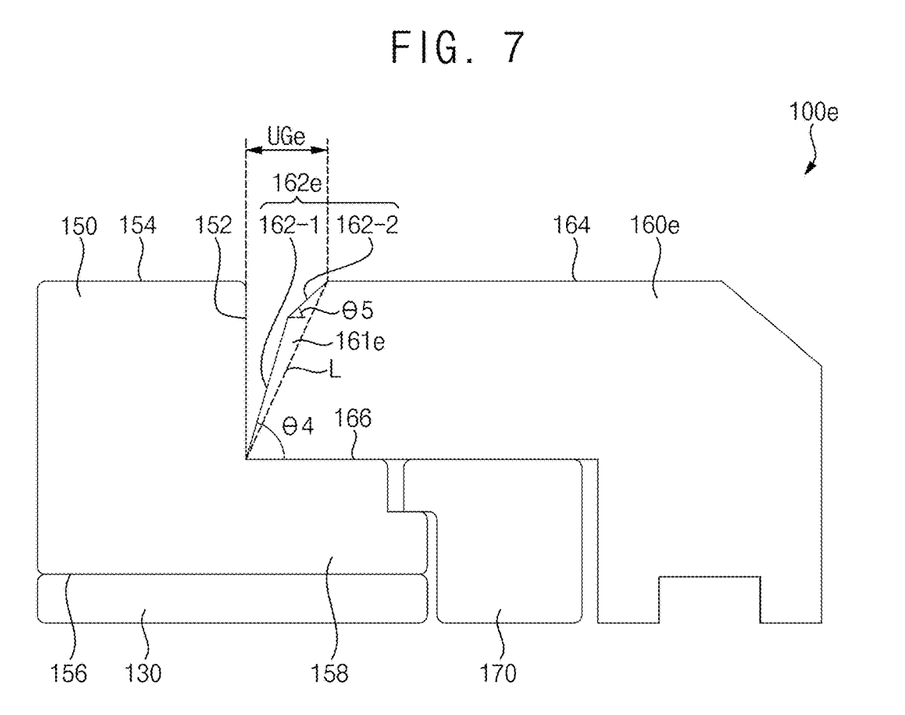
FIG. 7 is an enlarged cross-sectional view illustrating a focus ring of a CCP type apparatus in accordance with example embodiments.

FIG. 7 is an enlarged cross-sectional view illustrating a focus ring of a CCP type apparatus in accordance with example embodiments.

A CCP type apparatus 100e of example embodiments may include elements substantially the same as those of the CCP type apparatus 100 in FIG. 2, except for an outer ring of a focus ring. Thus, same reference numerals refer to the same elements and any further description with respect to the same elements is omitted herein for brevity.

Referring to FIG. 7, a thickness-compensating portion 161e of example embodiments may include a first inclined surface 162-1 and a second inclined surface 162-2. The first inclined surface 162-1 may be upwardly extended from the lower end of the inner circumferential surface 162e of the outer ring 160e. The first inclined surface 162-1 may have a fourth inclined angle θ4 with respect to the lower surface 166 of the outer ring 160e. The second inclined surface 162-2 may be upwardly extended from the upper end of the first inclined surface 162-1 to the upper end of the inner circumferential surface 162e of the outer ring 160e. The second inclined surface 162-2 may have a fifth inclined angle θ5 with respect to the lower surface 166 of the outer ring 160e.

Further, a length of the first inclined surface 162-1 may be longer than a length of the second inclined surface 162-2. For example, the length of the first inclined surface 162-1 may be substantially equal to or less than the length of the second inclined surface 162-2. When the length of the first inclined surface 162-1 is longer than the length of the second inclined surface 162-2, a connection point between the first inclined surface 162-1 and the second inclined surface 162-2, i.e., the upper end of the first inclined surface 162-1 or the lower end of the second inclined surface 162-2, may be positioned closer to the upper surface 164 of the outer ring 160e than the lower surface 166 of the outer ring 160e. Thus, an upper gap UGe between the upper end of the outer circumferential surface 152 of the inner ring 150 and the upper end of the inner circumferential surface 162e of the outer ring 160e may be narrower than the upper gap UG between the upper end of the outer circumferential surface 152 of the inner ring 150 and the upper end of the inner circumferential surface 162 of the outer ring 160 in FIG. 2. As a result, a volume of a space between the inner ring 150 and the outer ring 160e in FIG. 7 may be smaller than a volume of the space between the inner ring 150 and the outer ring 160 in FIG. 2.

Figure 8:
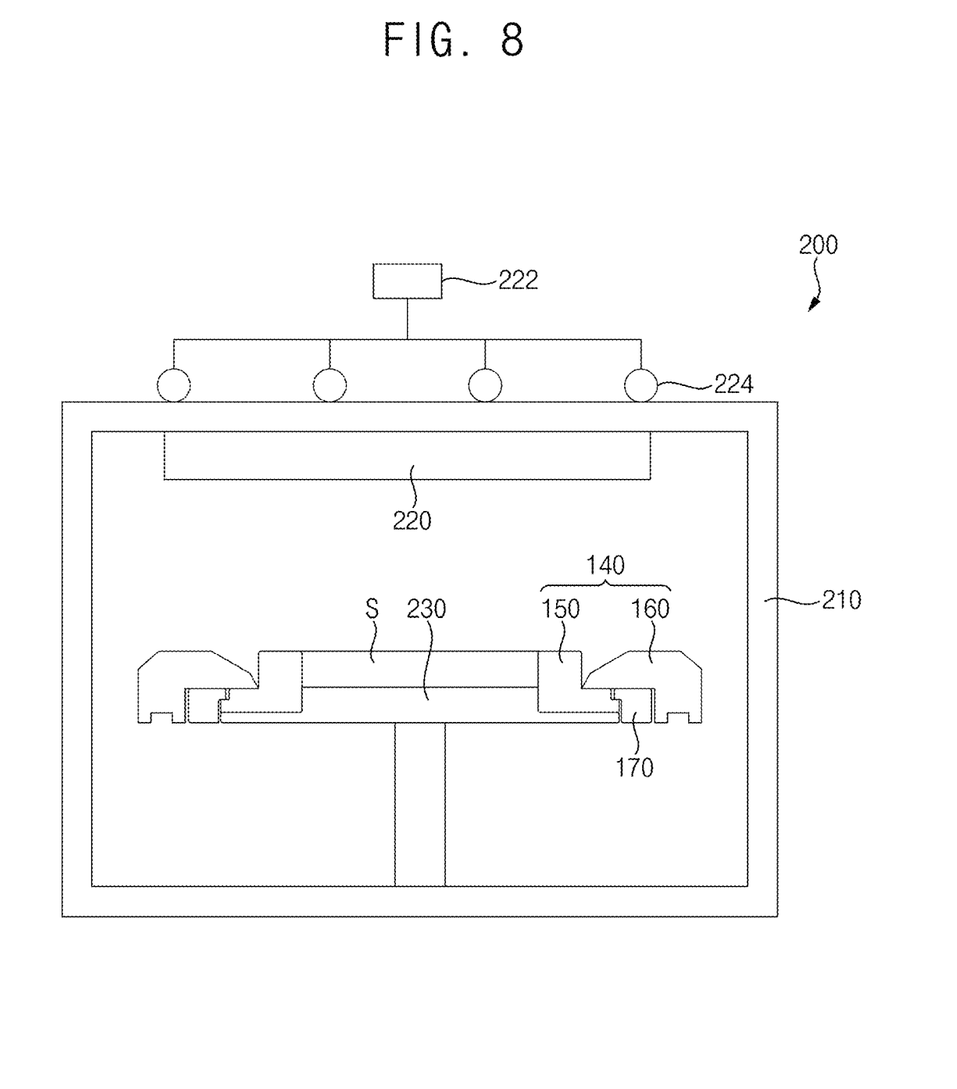
FIG. 8 is a cross-sectional view illustrating an inductively coupled plasma (ICP) type apparatus for processing a substrate in accordance with example embodiments.

FIG. 8 is a cross-sectional view illustrating an inductively coupled plasma (ICP) type apparatus for processing a substrate in accordance with example embodiments.

Referring to FIG. 8, an ICP type apparatus 200 may generate plasma from a reaction gas using a magnetic field induced by a coil antenna. An RF power applied to the coil antenna may be transmitted to the reaction gas through a dielectric window. The ICP type apparatus 200 may include semiconductor fabrication apparatuses configured to process the substrate using plasma in a reaction chamber, e.g., a deposition apparatus, an etching apparatus, an ashing apparatus, etc.

The ICP type apparatus 200 may include a reaction chamber 210, an antenna 224, a dielectric window 220, an ESC 230, a focus ring 140, etc. That is, the ICP type apparatus 200 may include the antenna 224 (e.g., a coil antenna) and the dielectric window 220 as the plasma generator.

The reaction chamber 210 may have an internal space configured to receive the substrate, e.g., the semiconductor substrate S. The reaction chamber 210 may have a vacuum region for defining a space where the plasma may be formed from the reaction gas.

The antenna 224 may be arranged on the upper surface of the reaction chamber 210. An RF power supply 222 may be connected to the antenna 224. A magnetic field induced by the antenna 224 may be applied to the reaction gas injected into the reaction chamber 210 to generate the plasma.

The dielectric window 220 may be arranged under the antenna 224. The dielectric window 220 may include a dielectric material. The dielectric window 220 may transmit the RF power in the antenna 224 into the reaction chamber 210. Further, the dielectric window 220 may inject the reaction gas into the reaction chamber 210.

The ESC 230 may be arranged at a lower region in the reaction chamber 210. An RF power supply may be connected to the ESC 230. A matcher may be arranged between the RF power supply and the ESC 230.

A plurality of lift holes may be vertically formed through the ESC 230. Additionally, a plurality of lift pins may be movably inserted into the lift holes of the ESC 20. The lift pins may support the semiconductor substrate S. The lift pins may be downwardly moved to place the semiconductor substrate S on an upper surface of the ESC 230. The lift pins may be upwardly moved with the semiconductor substrate S on which a plasma process may be performed.

The focus ring 140 may have a structure substantially the same as the structure of the focus ring 140 in FIG. 2. Thus, any further descriptions with respect to the focus ring 140 are omitted herein for brevity. Alternatively, the focus ring 140 may have the structure in FIG. 3, the structure in FIG. 4, the structure in FIG. 5, the structure in FIG. 6, or the structure in FIG. 7.

Figure 9:
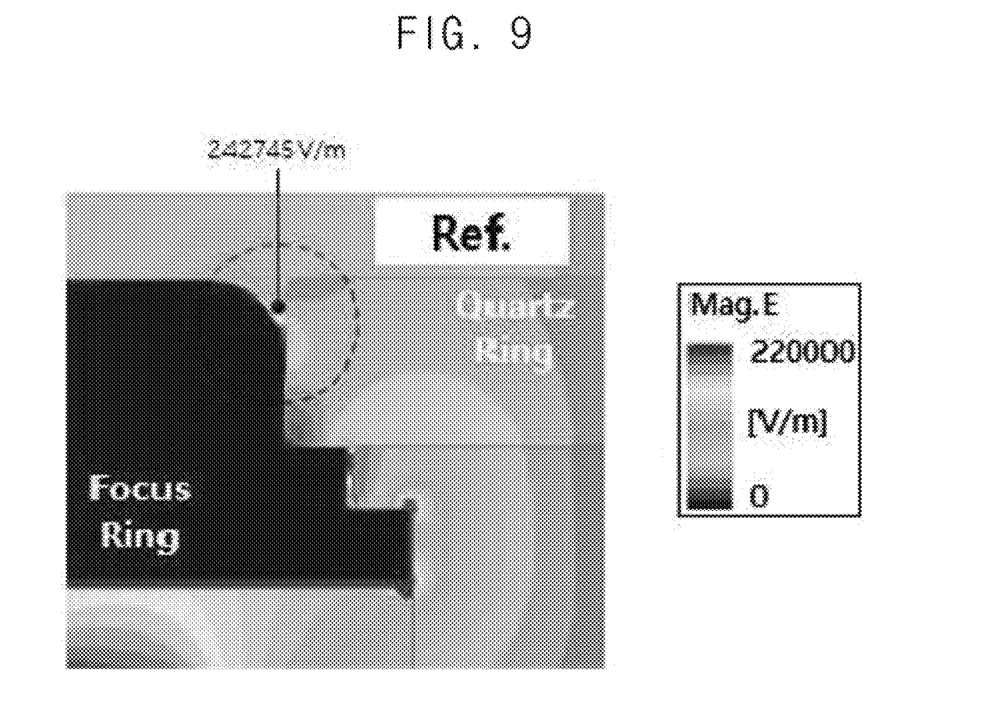
FIG. 9 is a view illustrating an electric field around a focus ring in accordance with a Comparative Example.
Figure 10:
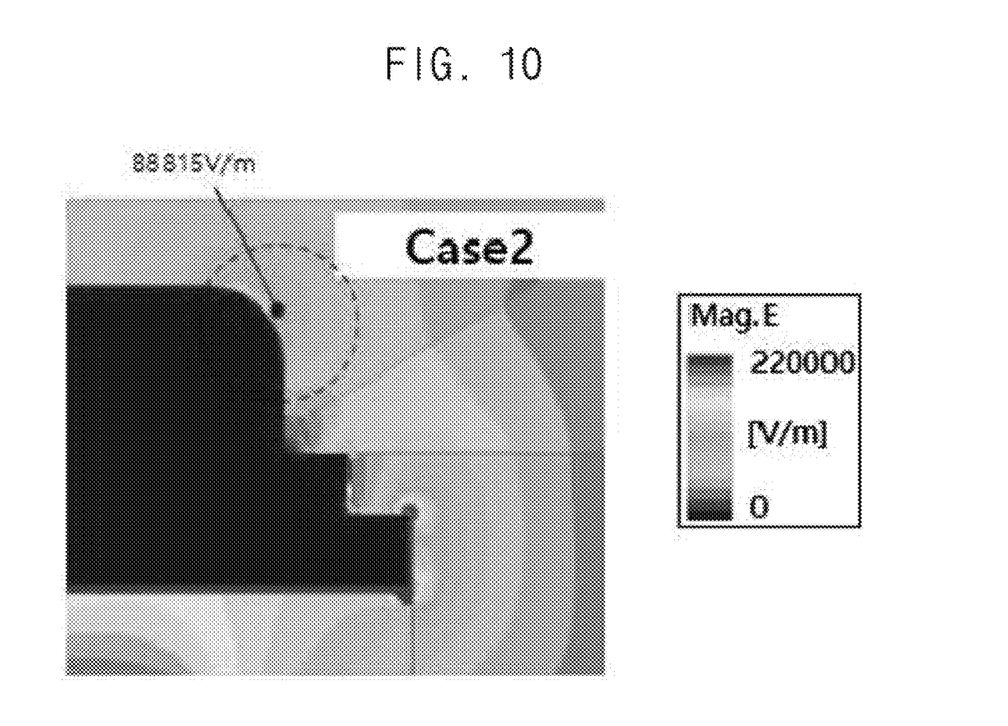
FIG. 10 is a view illustrating an electric field around the focus ring in FIG. 3.
Figure 11:
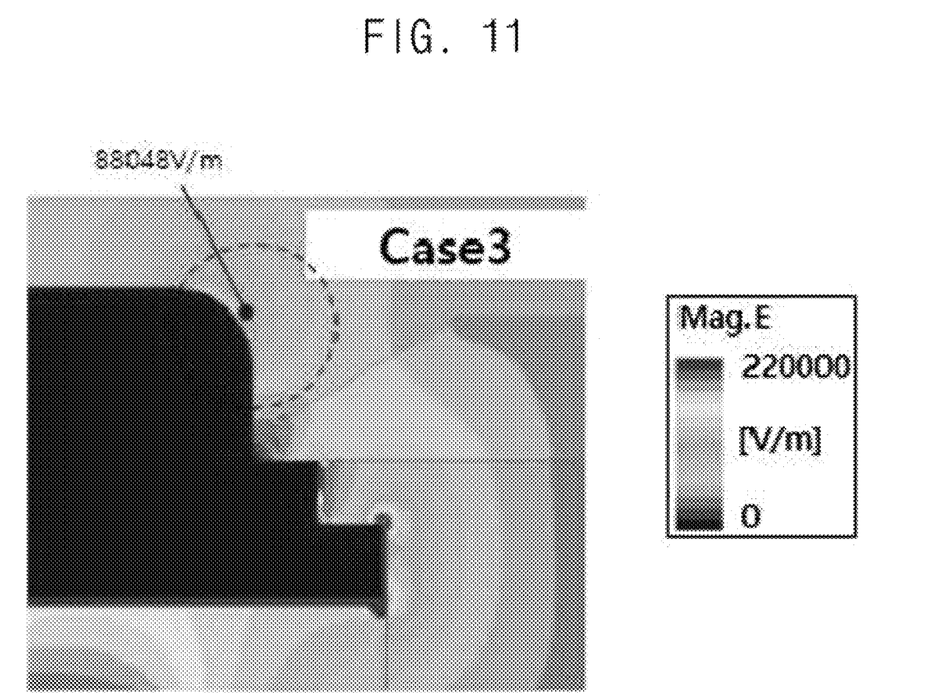
FIG. 11 is a view illustrating an electric field around the focus ring in FIG. 4.

FIG. 9 is a view illustrating an electric field around a focus ring in accordance with a Comparative Example, FIG. 10 is a view illustrating an electric field around the focus ring in FIG. 3, and FIG. 11 is a view illustrating an electric field around the focus ring in FIG. 4.

The focus ring in FIG. 9 may have a uniform gap between an inner ring and an outer ring. In contrast, the focus rings in FIGS. 10 and 11 may include the thickness-compensating portion, according to example embodiments.

Electric fields applied to the focus rings in FIGS. 9 to 11 were measured. Amounts of polymers deposited on the focus rings were measured. Results are shown in following Table.

|  | Comparative Example | Focus ring in FIG. 3 | Focus ring in FIG. 4 |
|---|---|---|---|
| Ratio of polymers on focus rings with respect to total amount of polymers (%) | 8.59% | 2.03% | 2.21% |
| Maximum electric field (E-field (kV/m) | 242.7 | 88.8 | 88.0 |

As shown in the Table above, it can be noted that a deposition ratio of the polymer on the focus ring was decreased from 8.59% to 2.03% or 2.21%. Thus, the non-uniform (i.e., non-constant width) space formed between the inner ring and the outer ring, according to example embodiments, reduces the deposition ratio of the polymer on the focus ring.

Further, it can be noted that the electric field applied to the focus rings may be decreased from 242.7 to 88.8 or 88.0. Thus, the space formed between the inner ring and the outer ring, according to example embodiments, reduces a concentration of the electric field by the focus ring.

By way of summation and review, polymers generated in a plasma process may be accumulated in a space between the inner ring and the outer ring of a focus ring, such that the accumulated polymers may cause an arcing.

In contrast, example embodiments provide a focus ring capable of suppressing generation of an arcing. Example embodiments also provide an apparatus for processing a substrate including the above-mentioned focus ring.

That is, according to example embodiments, the lower gap between the lower end of the outer circumferential surface of the inner ring and the lower end of the inner circumferential surface of the outer ring may be narrower than the upper gap between the upper end of the outer circumferential surface of the inner ring and the upper end of the inner circumferential surface of the outer ring so that a sufficient space may be formed between the inner ring and the outer ring. Thus, an air current may smoothly flow through the space between the inner ring and the outer ring. As a result, an accumulation of polymers in the air current between the inner ring and the outer ring may be suppressed so that an arc between the inner ring and the outer ring may also be suppressed.

Further, a thickness-compensating portion on the inner circumferential surface of the outer ring may be positioned higher than the straight line between the upper end and the lower end of the inner circumferential surface of the outer ring so that the thickness-compensating portion may provide the outer ring with a sufficiently thick thickness. Thus, a lifespan of the outer ring worn by the plasma may be extended.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A focus ring, comprising:
an inner ring on a periphery of an electrostatic chuck; and
an outer ring having an inner circumferential surface surrounding an outer circumferential surface of the inner ring,
wherein a lower gap between a lower end of the outer circumferential surface of the inner ring and a lower end of the inner circumferential surface of the outer ring is narrower than an upper gap between an upper end of the outer circumferential surface of the inner ring and an upper end of the inner circumferential surface of the outer ring, and
wherein the outer ring includes a thickness-compensating portion on the inner circumferential surface of the outer ring, the thickness-compensating portion being positioned higher than an imaginary straight line between the upper end and the lower end of the inner circumferential surface of the outer ring.

2. The focus ring as claimed in claim 1, wherein the thickness-compensating portion includes:
a first inclined surface extended from the lower end of the inner circumferential surface of the outer ring at a first inclined angle with respect to a lower surface of the outer ring; and
a second inclined surface extended from an upper end of the first inclined surface to the upper end of the inner circumferential surface of the outer ring at a second inclined angle with respect to the lower surface of the outer ring.

3. The focus ring as claimed in claim 2, wherein the first inclined angle is greater than the second inclined angle.

4. The focus ring as claimed in claim 2, wherein the thickness-compensating portion further includes a third inclined surface extended from the upper end of the first inclined surface to a lower end of the second inclined surface at a third inclined angle with respect to the lower surface of the outer ring.

5. The focus ring as claimed in claim 4, wherein the third inclined angle is less than the first inclined angle and greater than the second inclined angle.

6. The focus ring as claimed in claim 1, wherein the thickness-compensating portion includes a curved inner circumferential surface connected between the upper end and the lower end of the inner circumferential surface of the outer ring.

7. The focus ring as claimed in claim 1, wherein the lower end of the inner circumferential surface of the outer ring is in contact with the lower end of the outer circumferential surface of the inner ring.

8. The focus ring as claimed in claim 1, wherein the lower end of the inner circumferential surface of the outer ring is spaced apart from the lower end of the outer circumferential surface of the inner ring.

9. The focus ring as claimed in claim 1, wherein an upper surface of the outer ring is substantially coplanar with an upper surface of the inner ring.

10. The focus ring as claimed in claim 1, wherein an upper surface of the outer ring is positioned lower than an upper surface of the inner ring.

11. A focus ring, comprising:
an inner ring on a periphery of an electrostatic chuck; and
an outer ring having an inner circumferential surface surrounding an outer circumferential surface of the inner ring,
wherein a lower gap between a lower end of the outer circumferential surface of the inner ring and a lower end of the inner circumferential surface of the outer ring is narrower than an upper gap between an upper end of the outer circumferential surface of the inner ring and an upper end of the inner circumferential surface of the outer ring, wherein the inner circumferential surface of the outer ring includes:
- a first inclined surface extended from the lower end of the inner circumferential surface of the outer ring at a first inclined angle with respect to a lower surface of the outer ring, and
- a second inclined surface extended from an upper end of the first inclined surface to the upper end of the inner circumferential surface of the outer ring at a second inclined angle with respect to the lower surface of the outer ring, wherein the first inclined angle is greater than the second inclined angle, and wherein an upper surface of the outer ring is positioned lower than an upper surface of the inner ring.

12. The focus ring as claimed in claim 11, wherein the lower end of the inner circumferential surface of the outer ring is in contact with the lower end of the outer circumferential surface of the inner ring.

13. The focus ring as claimed in claim 11, wherein the lower end of the inner circumferential surface of the outer ring is spaced apart from the lower end of the outer circumferential surface of the inner ring.

14. An apparatus for processing a substrate, the apparatus comprising:
- a reaction chamber configured to receive the substrate;
- an electrostatic chuck in the reaction chamber, the electrostatic chuck being configured to support the substrate;
- a plasma generator configured to generate plasma from a reaction gas in the reaction chamber; and
- a focus ring on a periphery of the electrostatic chuck, the focus ring being configured to surround the substrate, and the focus ring including:
  - an inner ring on the periphery of the electrostatic chuck and configured to surround the substrate, and
  - an outer ring having an inner circumferential surface configured to surround an outer circumferential surface of the inner ring, wherein a lower gap between a lower end of the outer circumferential surface of the inner ring and a lower end of the inner circumferential surface of the outer ring is narrower than an upper gap between an upper end of the outer circumferential surface of the inner ring and an upper end of the inner circumferential surface of the outer ring, and wherein the outer ring includes a thickness-compensating portion on the inner circumferential surface of the outer ring, the thickness-compensating portion being positioned higher than an imaginary straight line between the upper end and the lower end of the inner circumferential surface of the outer ring.

15. The apparatus as claimed in claim 14, wherein the plasma generator includes a showerhead configured to inject the reaction gas into the reaction chamber.

16. The apparatus as claimed in claim 14, wherein the plasma generator includes:
- an antenna arranged on an upper surface of the reaction chamber; and
- a dielectric window arranged under the antenna.

17. The apparatus as claimed in claim 14, wherein the thickness-compensating portion includes:
- a first inclined surface extended from the lower end of the inner circumferential surface of the outer ring at a first inclined angle with respect to a lower surface of the outer ring; and
- a second inclined surface extended from an upper end of the first inclined surface to the upper end of the inner circumferential surface of the outer ring at a second inclined angle with respect to the lower surface of the outer ring, the first inclined angle being greater than the second inclined angle.

18. The apparatus as claimed in claim 14, wherein the lower end of the inner circumferential surface of the outer ring makes is in contact with the lower end of the outer circumferential surface of the inner ring.

19. The apparatus as claimed in claim 14, wherein an upper surface of the outer ring is substantially coplanar with an upper surface of the inner ring.

20. The apparatus as claimed in claim 14, wherein an upper surface of the outer ring is positioned lower than an upper surface of the inner ring.

* * * * *